United States Patent
Chen et al.

(10) Patent No.: US 12,167,557 B2
(45) Date of Patent: Dec. 10, 2024

(54) FLEXIBLE FOLDABLE DISPLAY MODULE, METHOD FOR MANUFACTURING THE SAME, AND FLEXIBLE FOLDABLE DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Qian Chen, Beijing (CN); Xiaofeng Luo, Beijing (CN); Hongqiang Luo, Beijing (CN)

(73) Assignees: Beijing BOE Technology Development Co., Ltd., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 17/800,269

(22) PCT Filed: Sep. 6, 2021

(86) PCT No.: PCT/CN2021/116787
§ 371 (c)(1),
(2) Date: Aug. 17, 2022

(87) PCT Pub. No.: WO2023/029057
PCT Pub. Date: Mar. 9, 2023

(65) Prior Publication Data
US 2024/0298416 A1 Sep. 5, 2024

(51) Int. Cl.
*G06F 1/16* (2006.01)
*G06V 40/13* (2022.01)
*H05K 5/03* (2006.01)

(52) U.S. Cl.
CPC .................. *H05K 5/03* (2013.01); *G06F 1/16* (2013.01); *G06V 40/1306* (2022.01); *G06V 40/1318* (2022.01)

(58) Field of Classification Search
CPC .. H05K 5/03; G06V 40/1306; G06V 40/1318; G06F 1/1609; G06F 1/1684; G06F 1/1637
See application file for complete search history.

(56) References Cited

U.S. PATENT DOCUMENTS

| | | | |
|---|---|---|---|
| 2019/0080140 A1* | 3/2019 | Lee | ........................ G06F 1/1637 |
| 2020/0168676 A1 | 5/2020 | Hu et al. | |

(Continued)

FOREIGN PATENT DOCUMENTS

| | | |
|---|---|---|
| CN | 110114779 A | 8/2019 |
| CN | 209373963 U | 9/2019 |

(Continued)

*Primary Examiner* — Abdul-Samad A Adediran
(74) *Attorney, Agent, or Firm* — IP & T GROUP LLP

(57) ABSTRACT

A flexible foldable display module includes a display substrate having a fingerprint identification region, a flexible cover plate disposed on a side of a display surface of the display substrate, a support plate located on a side of the display substrate away from the display surface thereof, and an adhesive layer located between the support plate and the display substrate. The support plate includes a first portion and a second portion other than the first portion. The first portion covers at least the fingerprint identification region. A thickness of the first portion is less than a thickness of the second portion, and a surface of the first portion proximate to the display substrate is flush with a surface of the second portion proximate to the display substrate. The adhesive layer includes a first adhesive layer, a first base layer, and a second adhesive layer that are sequentially stacked.

20 Claims, 9 Drawing Sheets

(56) References Cited

U.S. PATENT DOCUMENTS

2020/0233458 A1\* 7/2020 We .................. G06F 1/1609
2021/0405690 A1\* 12/2021 We .................. G06F 1/1684

FOREIGN PATENT DOCUMENTS

| CN | 110709860 A | 1/2020 |
| CN | 110770750 A | 2/2020 |
| CN | 110799990 A | 2/2020 |
| CN | 111222391 A | 6/2020 |
| CN | 111223400 A | 6/2020 |
| CN | 112149452 A | 12/2020 |
| KR | 10-2017-0126335 A | 11/2017 |

\* cited by examiner

FLEXIBLE FOLDABLE DISPLAY MODULE, METHOD FOR MANUFACTURING THE SAME, AND FLEXIBLE FOLDABLE DISPLAY APPARATUS

CROSS-REFERENCE TO RELATED APPLICATION

This application is a national phase entry under 35 USC 371 of International Patent Application No. PCT/CN2021/116787, filed on Sep. 6, 2021, which is incorporated herein by reference in its entirety.

TECHNICAL FIELD

The present disclosure relates to the field of display technologies, for example, to a flexible foldable display module and a method for manufacturing the same, and a flexible foldable display apparatus.

BACKGROUND

An under-screen fingerprint identification technology can provide mobile phones or other terminal devices with a high screen-to-body ratio, which provides a good display experience for users. At present, the under-screen fingerprint identification technology such as an ultrasonic under-screen fingerprint identification technology or an optical under-screen fingerprint identification technology are mostly used in the terminal devices.

SUMMARY

In an aspect, a flexible foldable display module is provided. The flexible foldable display module includes a display substrate, a flexible cover plate, a support plate and an adhesive layer. The display substrate is provided with a fingerprint identification region therein. The flexible cover plate is disposed on a side of a display surface of the display substrate. The support plate is located on a side of the display substrate away from the display surface thereof. The support plate includes a first portion and a second portion other than the first portion. The first portion covers at least the fingerprint identification region. A thickness of the first portion is less than a thickness of the second portion, and a surface of the first portion proximate to the display substrate is flush with a surface of the second portion proximate to the display substrate. The adhesive layer is located between the support plate and the display substrate. The adhesive layer includes a first adhesive layer, a first base layer, and a second adhesive layer that are stacked in sequence.

In some embodiments, the first adhesive layer includes at least one of an optically clear adhesive or a pressure sensitive adhesive, and the second adhesive layer includes at least one of another optically clear adhesive or another pressure sensitive adhesive.

In some embodiments, a thickness of the adhesive layer is greater than or equal to 25 µm and less than or equal to 50 µm.

In some embodiments, the thickness of the first portion is greater than or equal to 30 µm and less than or equal to 50 µm.

In some embodiments, the thickness of the first portion is 0.2 to 0.34 times the thickness of the second portion.

In some embodiments, the support plate is a metal plate.

In some embodiments, at least a portion of the adhesive layer covering the fingerprint identification region is configured to be in a transparent state. The support plate is a light-transmissive plate, and a light transmittance of an entirety of a portion of the first portion covering the fingerprint identification region and the portion of the adhesive layer covering the fingerprint identification region is greater than 85%.

In some embodiments, the second portion is disposed on at least one side of the first portion. The second portion and the first portion define a depression. The depression has a bottom surface and side surfaces, and an opening of the depression faces away from the display substrate.

In some embodiments, the flexible foldable display module further includes an adhesive structure disposed on the bottom surface of the depression.

In some embodiments, a thickness of the adhesive structure is less than or equal to a depth of the depression.

In some embodiments, a thickness of the adhesive structure is greater than or equal to 12 µm and less than or equal to 15 µm.

In some embodiments, the flexible foldable display module further includes a back film located between the adhesive layer and the display substrate.

In some embodiments, a material of the flexible cover plate includes at least one of colorless polyimide or ultra-thin glass.

In some embodiments, the flexible foldable display module further includes a hardened coating on a surface of the flexible cover plate away from the display substrate.

In another aspect, a method for manufacturing a flexible foldable display module is provided. The method includes: providing a display substrate, the display substrate being provided with a fingerprint identification region therein; providing a flexible cover plate on a side of a display surface of the display substrate; and providing an adhesive layer and a support plate sequentially on a side of the display substrate away from the display surface thereof. The support plate includes a first portion and a second portion other than the first portion. The first portion covers at least the fingerprint identification region. A thickness of the first portion is less than a thickness of the second portion, and a surface of the first portion proximate to the display substrate is flush with a surface of the second portion proximate to the display substrate. The adhesive layer includes a first adhesive layer, a first base layer, and a second adhesive layer that are stacked in sequence.

In some embodiments, providing the adhesive layer and the support plate sequentially on the side of the display substrate away from the display surface thereof includes: bonding the adhesive layer to the support plate; and bonding a surface of the bonded adhesive layer away from the support plate to the side of the display substrate away from the display surface.

In yet another aspect, a flexible foldable display apparatus is provided. The flexible foldable display apparatus includes the flexible foldable display module according to any of the above embodiments, and a fingerprint sensor located on a side of the support plate away from the display substrate.

In some embodiments, in a case where the second portion and the first portion define a depression for installing the fingerprint sensor, the depression has a bottom surface and side surfaces, and an opening of the depression faces away from the display substrate; at least a portion of the fingerprint sensor is located in the depression, and the fingerprint sensor and the side surfaces of the depression have a gap therebetween.

In some embodiments, the fingerprint sensor includes: a circuit substrate disposed proximate to the bottom surface of the depression; a piezoelectric material layer located on a side of the circuit substrate away from the bottom surface of the depression; an electrode layer located on a side of the piezoelectric material layer away from the circuit substrate; an encapsulation protective film located on a side of the electrode layer away from the piezoelectric material layer; a chip on film (COF) disposed on the side of the circuit substrate away from the bottom surface of the depression; and a control chip disposed on the chip on film.

In some embodiments, the flexible foldable display apparatus further includes an edge sealing adhesive disposed in the gap between the fingerprint sensor and the side surfaces of the depression.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings.

In addition, the accompanying drawings to be described below may be regarded as schematic diagrams, but are not limitations on an actual size of a product, an actual process of a method, and an actual timing of a signal involved in the embodiments of the present disclosure.

DETAILED DESCRIPTION

Figure 1:
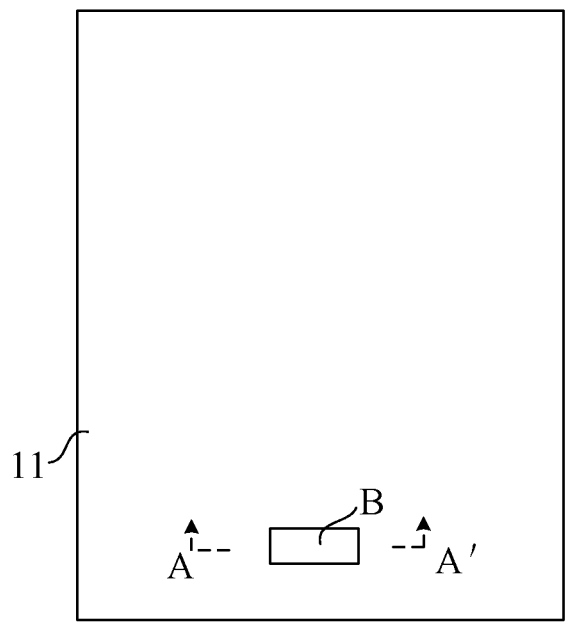
FIG. 1 is a front view showing a structure of a flexible foldable display module, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components have direct physical or electrical contact. However, the term "coupled" or "communicatively coupled" may also mean that two or more components are not in direct contact with each other, but still cooperate or interact with each other. The embodiments disclosed herein are not necessarily limited to the content herein.

Exemplary embodiments are described herein with reference to sectional views and/or plan views as idealized exemplary drawings. In the accompanying drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations in the shape due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Figure 2:
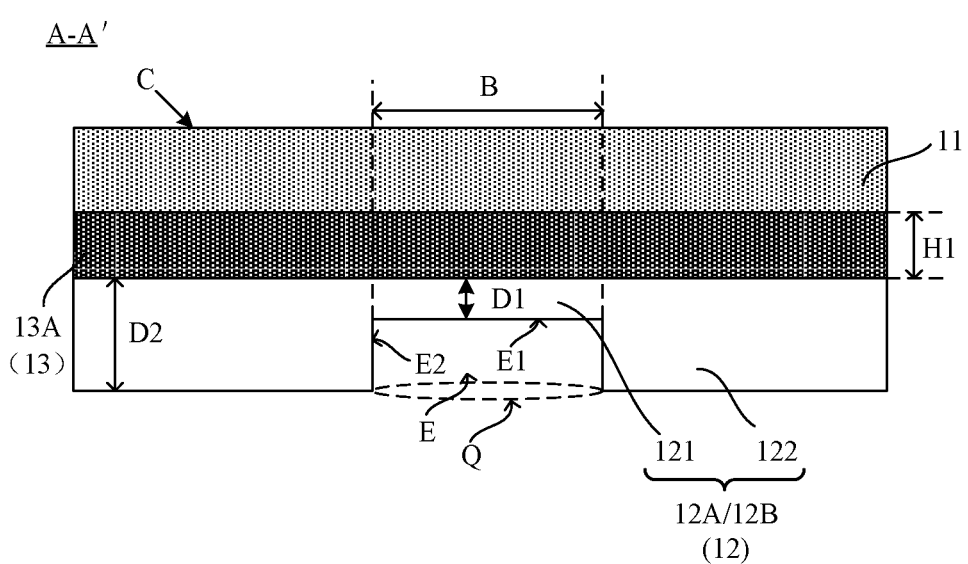
FIG. 2 is a cross-sectional view taken along a line A-A' in FIG. 1.

Some embodiments of the present disclosure provide a flexible foldable display module 1. Referring to FIGS. 1 and 2, the flexible foldable display module 1 includes a display substrate 11, a support plate 12 and an adhesive layer 13.

As shown in FIG. 1, the display substrate 11 is provided with a fingerprint identification region B therein. For example, the display substrate 11 is a foldable flexible display substrate.

Here, the fingerprint identification region B is located in a display region of the display substrate 11. FIG. 1 is illustrated by considering an example in which a border of the fingerprint recognition region B is located within a border of the display region of the display substrate 11. It will be understood that, in some other examples, part of the border of the fingerprint recognition region B may coincide with part of the border of the display region of the display substrate 11.

The display substrate 11 includes pixel driving circuits and a plurality of light-emitting devices. The pixel driving circuits each drive a light-emitting device to emit light, so that the display substrate 11 may display an image. It can be understood that, the fingerprint identification region B may also display the image.

As shown in FIG. 2, the support plate 12 is located on a side of the display substrate 11 away from a display surface C of the display substrate 11. The adhesive layer 13 is located between the display substrate 11 and the support plate 12. At least a portion of the adhesive layer 13 covering the fingerprint recognition region B is configured to be of a dense structure. It will be understood that, the dense structure means that an interior of the structure is arranged closely with little air gap. For example, a proportion of the air gap in the dense structure does not exceed 5%.

In some implementations, the support plate 12 and the display substrate 11 are provided with foam therebetween as a vibration-damping adhesive layer. It is found through research that the foam cannot transmit light as the foam is opaque. In addition, the foam has gaps therein, and air exists in the gaps. A volume of the air may account for 80% of an overall volume of the foam. Since ultrasonic waves will be totally reflected in the air, the foam is not suitable for transmitting the ultrasonic waves.

In the flexible foldable display module 1 provided in some embodiments of the present disclosure, the adhesive layer 13 is provided between the display substrate 11 and the support plate 12, which may play a role of vibration damping and buffering. In addition, at least the portion of the adhesive layer 13 covering the fingerprint recognition region B is configured to be of the dense structure, which may solve the problem that it is difficult to effectively transmit ultrasonic waves due to the large proportion of air gaps in the foam material. Thus, it is conducive to provide an under-screen ultrasonic fingerprint sensor.

In some embodiments, with continued reference to FIG. 2, the adhesive layer 13 is an optically clear adhesive (OCA) layer 13A.

It will be understood that, the optically clear adhesive layer 13A is of a single layer structure. The optically clear adhesive layer 13A itself has adhesiveness and may be directly bonded to a surface of the support plate without an additional adhesive layer. The optically clear adhesive may play a good role of buffering and vibration damping and is a solid material, so that the portion of the adhesive layer 13 covering the fingerprint identification region B may be ensured to be of the dense structure.

Figure 3:
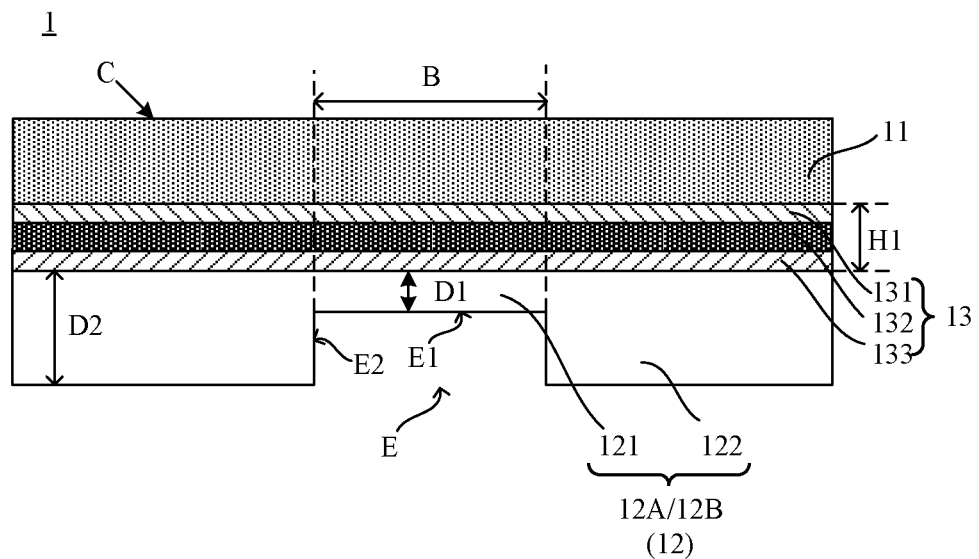
FIG. 3 is a cross-sectional view showing a structure of a flexible foldable display module, in accordance with some embodiments of the present disclosure.

In some embodiments, as shown in FIG. 3, the adhesive layer 13 includes a first adhesive layer 131, a first base layer 132 and a second adhesive layer 133 that are stacked in sequence.

It will be understood that, in the embodiments, the adhesive layer 13 is of a stacked structure. The first base layer 132 mainly plays a role of buffering and vibration damping. The first base layer 132 may achieve bonding through the first adhesive layer 131 and the second adhesive layer 133 on two sides of the first base layer 132.

In some embodiments, the first adhesive layer includes at least one of an optically clear adhesive or a pressure sensitive adhesive (PSA), and the second adhesive layer includes at least one of another optically clear adhesive or another pressure sensitive adhesive.

For example, the first adhesive layer 131 and the second adhesive layer 133 are both made of pressure sensitive adhesives.

For another example, the first adhesive layer 131 and the second adhesive layer 133 are both made of optically clear adhesives.

For yet another example, one of the first adhesive layer 131 and the second adhesive layer 133 is made of the pressure sensitive adhesive, and the other thereof is made of the optically clear adhesive.

With this design, it is conducive for the first base layer 132 to achieving good bonding through the first adhesive layer 131 and the second adhesive layer 133 on two sides of the first base layer 132.

In some embodiments, a material of the first base layer 132 includes at least one of polyethylene terephthalate (PET), polyimide (PI) or a copper-base material.

With this design, the adhesive layer 13 may play the role of buffering and vibration damping, and have a certain flexibility and a good supporting performance.

In some embodiments, a thickness H1 of the adhesive layer 13 satisfies that H1 is greater than or equal to 25 μm and less than or equal to 50 μm (i.e., 25 μm≤H1≤50 μm). For example, the thickness H1 of the adhesive layer 13 is 25 μm, 35 μm or 50 μm.

In a case where the thickness H1 of the adhesive layer 13 is in the range of 25 μm to 50 μm, if the thickness of the adhesive layer 13 approaches or is equal to 50 μm, it may be ensured that the adhesive layer 13 plays the good role of buffering and vibration damping while satisfying signal transmission efficiency; and if the thickness of the adhesive layer 13 approaches or is equal to 25 μm, it may avoid excessive attenuation of a signal transmitted in the adhesive layer 13 while the adhesive layer 13 plays the role of buffering and vibration damping.

In addition, it will be noted that, due to certain uncontrollable errors (e.g., manufacturing process errors, equipment accuracy and measurement errors), in a case where the thickness H1 of the adhesive layer 13 is 24.5 μm, 24.86 μm or other values (for example, a floating range of the thickness H1 does not exceed 0.5 μm), it may also be considered that the thickness H1 of the adhesive layer 13 satisfies the limiting condition of being equal to 25 μm; and in a cases where the thickness H1 of the adhesive layer 13 is 50.2 μm, 50.25 μm or other values (for example, a floating range of the thickness H1 does not exceed 0.5 μm), it may also be considered that the thickness H1 of the adhesive layer 13 satisfies the limiting condition of being equal to 50 μm.

In summary, in the flexible foldable display module 1 provided in some embodiments of the present disclosure, the adhesive layer 13 is provided between the display substrate 11 and the support plate 12, and the adhesive layer 13 may include the first adhesive layer 131, the first base layer 132 and the second adhesive layer 133 that are stacked in sequence. In this way, the good effect of buffering and vibration damping may be realized. In addition, since at least the portion of the adhesive layer 13 covering the fingerprint recognition region B is configured to be of the dense structure (e.g., portions of the first adhesive layer 131, the first base layer 132 and the second adhesive layer 133 that are stacked sequentially corresponding to the fingerprint recognition region B), it may solve the problem that it is difficult to effectively transmit the ultrasonic waves due to the large proportion of the air gaps in the foam. Thus, it is conducive to provide the under-screen ultrasonic fingerprint sensor.

In some embodiments, referring to FIGS. 2 to 8B, the support plate 12 includes a first portion 121 and a second portion 122 other than the first portion 121. The first portion 121 covers at least the fingerprint identification region B. A thickness D1 of the first portion is less than a thickness D2 of the second portion.

The phrase "covering at least" means that the first portion 121 may only cover the fingerprint recognition region B; or the first portion 121 may further cover a peripheral region of the fingerprint recognition region B in addition to the fingerprint recognition region B.

It is found through research that, when the under-screen fingerprint structure is provided, a support structure on a back side of the display substrate is thick and has a large acoustic resistance, which makes it difficult for the ultrasonic waves and light rays to pass through the support structure. Therefore, in some implementations, a window is provided in the support structure (e.g., a heat dissipation film, a steel sheet and the foam) on the back side of the display substrate, so that light rays or ultrasonic waves reflected by fingerprints of a finger on a display side of the display substrate may be successfully transmitted to the fingerprint structure on the back side of the display substrate, thereby achieving the fingerprint identification function. However, in a case where the under-screen fingerprint structure is applied to the flexible display screen, an overall thickness of the flexible foldable display module in the flexible display screen is thin, the under-screen fingerprint structure is only supported by a rigid support plate that is on the back side of the display substrate, and other stacked layers in the flexible display screen except for the support plate are made of soft materials that are easy to be bent. Therefore, if the above manner of providing the window is used to achieve attaching of the fingerprints, after the window is provided on a portion of the support plate that is on the back side of the flexible display screen, it is easy to cause problems such as local collapse or poor impression in the fingerprint identification region.

In the flexible foldable display module 1 provided in some embodiments of the present disclosure, a side of the first portion 121 away from the display substrate 11 is used to arrange a fingerprint sensor thereon, so that signals sent from or received by the fingerprint sensor need to pass through the display substrate 11 and the first portion 121. On one hand, since the thickness D1 of the first portion 121 is less than the thickness D2 of the second portion 122, by arranging the fingerprint sensor on the first portion 121, it may be possible to reduce the attenuation of the signals that pass through the first portion 121, and ensure the transmission efficiency and response sensitivity. On the other hand, for the support plate 12, the thickness D1 of the first portion 121 is less than the thickness D2 of the second portion 122, compared with a complete through structure in which the window is provided in the support plate 12 in the related art, the local thinning of the support plate 12 may enhance a supporting force of the first portion 121 of the support plate 12, so as to avoid the problems such as local collapse or poor impression at a position, corresponding to the first portion 121, of the display substrate 11 on the side of the support plate 12.

Figure 4:
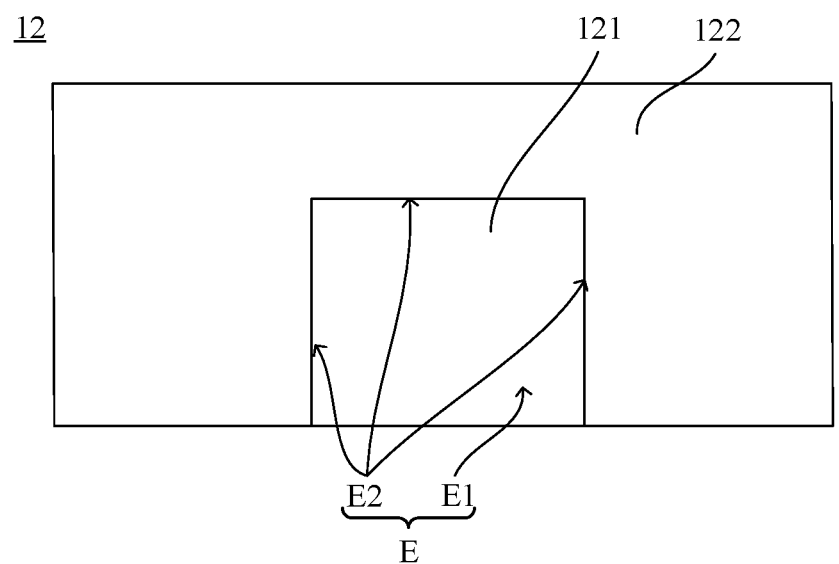
FIG. 4 is a diagram showing a structure of a support plate, in accordance with some embodiments of the present disclosure.
Figure 5:
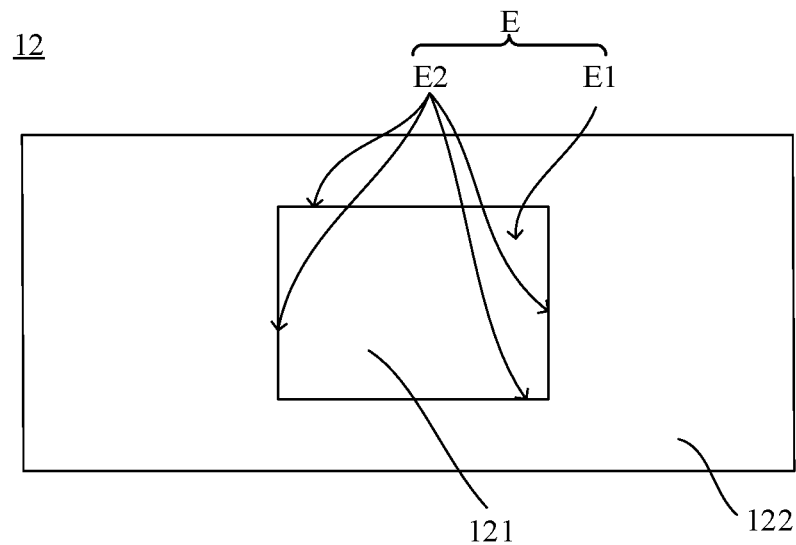
FIG. 5 is a diagram showing a structure of another support plate, in accordance with some other embodiments of the present disclosure.

In some examples, the second portion 122 may be disposed around edge(s) of the first portion 121. For example, the second portion 122 is disposed around some edges of the first portion 121. As shown in FIG. 4, the second portion 122 is disposed around three edges of the first portion 121. For another example, as shown in FIG. 5, the second portion 122 is disposed around all the edges of the first portion 121.

In some embodiments, as shown in FIGS. 2 and 3, a surface of the first portion 121 proximate to the display substrate 11 is flush with a surface of the second portion 122 proximate to the display substrate 11.

With this design, it may be ensured that the support plate 12 is closely attached with the display substrate 11 at any position thereof, and there is no gap between the support plate 12 and the display substrate 11, thereby avoiding an air layer exists in the signal transmission path, and avoiding a difference of transmission parameters of signals that pass through different positions at an interface between the support plate 12 and the display substrate 11.

In some embodiments, the thickness D1 of the first portion 121 is greater than or equal to 30 μm and less than or equal to 50 μm. For example, the thickness D1 of the first portion 121 may be 30 μm, 45 μm, 48 μm, or 50 μm.

It will be noted that, the greater the thickness D1 of the first portion 121, the worse the transmission effect of the signal (that is, the more the signal attenuation), but the better the supporting effect of the first portion 121. In contrast, the less the thickness D1 of the first portion 121, the better the transmission effect of the signal, but the weaker the supporting effect of the first portion 121. In a case where the thickness D1 of the first portion 121 is equal to or approaches 30 μm, it may be possible to further improve the transmission efficiency of the signals in the first portion 121 while enabling the support plate 12 to play a good supporting effect on the display substrate 11. In a case where the thickness D1 of the first portion 121 is less than or equal to 50 μm, the transmission efficiency of the signals in the first portion 121 may be ensured. In addition, in a case where the thickness D1 of the first portion 121 is equal to or approaches 50 μm, it may be possible to enable the support plate 12 to play a better supporting effect on the display substrate 11 while effectively improving the transmission efficiency of the signals in the first portion 121. That is, it may be possible to better avoid the problems such as local collapse or poor impression at the position, corresponding to the first portion 121, of the display substrate 11 on the side of the support plate 12.

In addition, it will be noted that, due to certain uncontrollable errors (e.g., manufacturing process errors, equipment accuracy and measurement errors), in a case where the thickness D1 of the first portion 121 is 30.6 μm, 30.82 μm or other values (for example, a floating range of the thickness D1 does not exceed 0.5 μm), it may also be considered that the thickness D1 of the first portion 121 satisfies the limiting condition of being equal to 30 μm; and in a case where the thickness D1 of the first portion 121 is 50.2 μm, 50.25 μm or other values (e.g., a floating range of the thickness D1 does not exceed 0.5 μm), it may also be considered that the thickness D1 of the first portion 121 satisfies the limiting condition of being equal to 50 μm.

For example, the thickness D1 of the first portion 121 may be in a range of 30 μm to 40 μm, inclusive.

With this design, it may not only ensure the transmission efficiency of the signals in the first portion 121, but also further improve the supporting effect of the support plate 12 on the display substrate 11.

In some embodiments, the thickness D1 of the first portion 121 is 0.2 to 0.34 times the thickness D2 of the second portion 122.

With this design, the transmission efficiency of the signals in the first portion 121 may be improved, and a thickness difference between the first portion 121 and the second portion 122 of the support plate 12 will not be excessively large (that is, supporting effects of the first portion 121 and the second portion 122 are similar). As a result, it may prevent a large level difference between a portion of the display substrate 11 corresponding to the first portion 121 and a portion of the display substrate 11 corresponding to the second portion 122.

In some examples, the thickness D2 of the second portion 122 of the support plate 12 is 150 μm, and the thickness of the first portion 121 of the support plate 12 is 30 μm, 45 μm, or 50 μm.

In some embodiments, referring to FIGS. 2 and 3, the support plate 12 is a metal plate 12A.

Metal materials can transmit ultrasonic waves, and the metal plate 12A has a strong supporting effect. In the case where the support plate 12 is the metal plate 12A, the fingerprint sensor may be an ultrasonic wave sensor. In addition, the metal plate further has a good heat dissipation effect.

In some examples, a material of the metal plate 12A includes at least one of stainless steel, titanium alloy, aluminum alloy, or indium.

In some embodiments, referring to FIGS. 2 and 3, at least the portion of the adhesive layer covering the fingerprint recognition region is configured to be in a transparent state. The support plate is a light-transmissive plate 12B. A light transmittance of an entirety of a portion of the first portion 121 covering the fingerprint identification region and the portion of the adhesive layer covering the fingerprint identification region is greater than 85%.

With this design, the fingerprint sensor may be an optical fingerprint sensor, and signals sent from and received by the optical fingerprint sensor are light signals. The light transmittance of the entirety of the portion of the first portion 121 covering the fingerprint identification region and the portion of the adhesive layer covering the fingerprint identification region is greater than 85%, which may ensure the light transmission efficiency. It will be noted that, in this case, other stacked layers located between the support plate 12 and the display substrate 11 may also be transparent layers that may transmit the light signals.

In some examples, a material of the light-transmissive plate 12B includes at least one of glass or plastic.

In some embodiments, as shown in FIGS. 2 to 6, the second portion 122 is disposed on at least one side of the first portion 121. The second portion 122 and the first portion 121 define a depression E for installing the fingerprint sensor. The depression E has a bottom surface E1 and side surfaces E2. An opening Q of the depression E faces away from the display substrate 11.

Since thicknesses of the first portion 121 and the second portion 122 are different, the depression E is formed on a surface of the support plate 12, and the opening of the depression E is provided on the side of the support plate 12 away from the display substrate 11. As a result, it may be possible to arrange the fingerprint sensor in the depression E. The side surfaces E2 and the bottom surface E1 of the depression E provide support surfaces for the fingerprint sensor, which may ensure that the fingerprint sensor is installed firmly and reliably.

In some examples, a radial dimension of the opening of the depression E is larger than radial dimensions of other portions of the depression E other than the opening. With this design, it may reduce an installation difficulty of the fingerprint sensor, and facilitate fixing the fingerprint sensor after the fingerprint sensor is installed, thereby improving installation efficiency.

For example, the side surfaces of the depression E may be arranged in a step shape, so that the radial dimension of the depression E may gradually increase in a direction from the bottom surface E1 to the opening of the depression. Of course, the side surfaces of the depression E may be directly arranged as an inclined surface, which is not limited in the embodiments of the present disclosure.

In the example, the side surfaces of the depression E are each arranged in the step shape. On one hand, it may accurately position the fingerprint sensor utilizing portions of the side surfaces E2 proximate to the bottom surface E1 that have a relatively small radial dimension. On the other hand, it may realize a purpose of facilitating the installation of the fingerprint sensor utilizing portions of the side surfaces E2 proximate to the opening that have a relatively large radial dimension, and facilitate applying adhesive between the fingerprint sensor and the depression after the fingerprint sensor is installed, so as to further realize the fixation of the fingerprint sensor.

In some examples, the depression E is formed by etching. For example, the support plate 12 is of a one-piece structure, a portion of the support plate 12 corresponding to the first portion 121 is etched, so as to partially thin the support plate 12. As a result, the depression E may be formed on the support plate 12. The first portion 121 and the second portion 122 having different thicknesses are formed on the support plate 12, and the manufacturing process thereof is simple.

Figure 6:
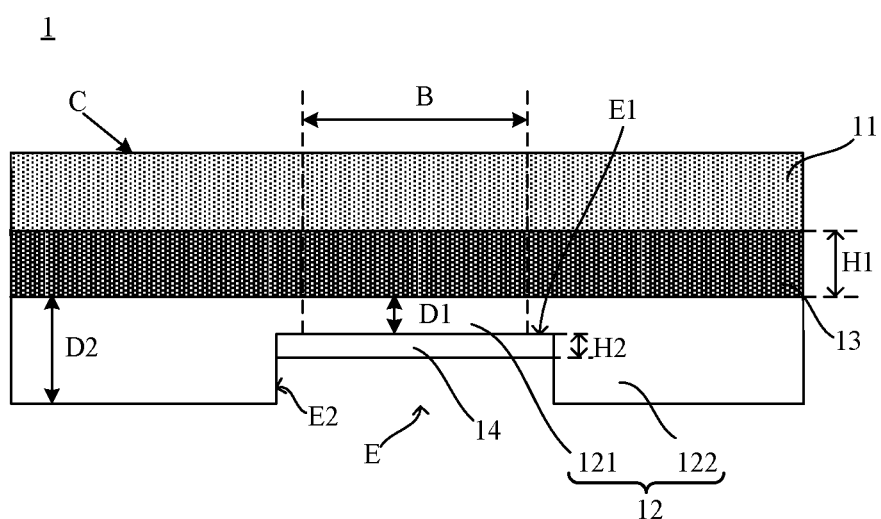
FIG. 6 is a cross-sectional view showing a structure of another flexible foldable display module, in accordance with some embodiments of the present disclosure.
Figure 7:
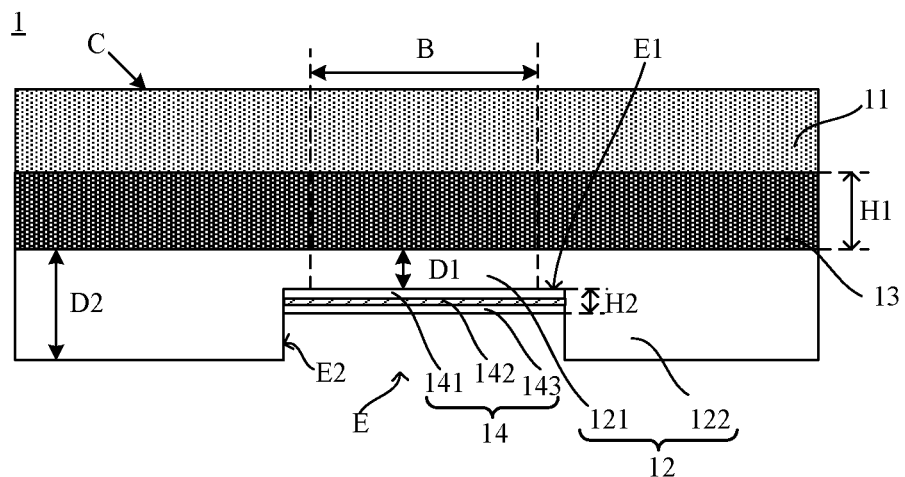
FIG. 7 is a cross-sectional view showing a structure of yet another flexible foldable display module, in accordance with some embodiments of the present disclosure.

In some embodiments, as shown in FIGS. 6 and 7, the flexible foldable display module 1 further includes an adhesive structure 14. The adhesive structure 14 is disposed on the bottom surface E1 of the depression E. The adhesive structure 14 is used for bonding the fingerprint sensor to the bottom surface E1 of the depression E.

The adhesive structure 14 may be used to fix the fingerprint sensor on the bottom surface E1 of the depression E, so as to strengthen the fixation of the fingerprint sensor on the bottom surface E1 of the depression E. In addition, by arranging the adhesive structure 14, it may be possible to avoid that a gap between the fingerprint sensor and the bottom surface E1 of the depression E, so as to prevent the ultrasonic waves from being totally reflected in the air in the gap and affecting the transmission of the ultrasonic waves.

In some examples, the adhesive structure 14 is disposed on the bottom surface E1 of the depression E, and a protective layer is provided on a surface of the adhesive structure 14. When the adhesive structure 14 needs to be used, the protective layer can be torn off to perform bonding.

In some examples, referring to FIG. 6, the adhesive structure 14 has a single layer structure. In this way, an adhesive layer of the adhesive structure 14 is made of a same material. Therefore, a pasting operation is convenient, and parameters such as resistance are easy to be calculated, so as to facilitate the design of the thickness of the adhesive layer. For example, a material of the adhesive structure 14 includes a water-based adhesive.

The adhesive layer is made of the water-based adhesive. The water-based adhesive uses water as a primary solvent and is liquid at a room temperature. The water-based adhesive forms a continuous adhesive film after the water-based adhesive is applied and then the water volatilizes, which is convenient to use. The volatile components have less pollution to the environment.

For example, the water-based adhesive is an epoxy resin adhesive.

In some other examples, referring to FIG. 7, the adhesive structure 14 has a multi-layer structure. The multi-layer structure includes a third adhesive layer 141, a second base layer 142 and a fourth adhesive layer 143 that are stacked in sequence.

The adhesive structure 14 is of a stacked multi-layer structure, and a direction in which the multiple-layer structure is stacked is a depth direction of the depression E. That is, the third adhesive layer 141 is bonded to the bottom surface E1 of the depression E, the fourth adhesive layer 143 is bonded to the fingerprint sensor, the second base layer 142 is bonded to both the third adhesive layer 141 and the fourth adhesive layer 143. In this way, it may be possible to avoid a direct contact between the second base layer 142 and the fingerprint sensor or between the second base layer 142 and the depression E.

In some examples, a material of the second base layer 142 includes at least one of polyethylene terephthalate or copper.

In some examples, the third adhesive layer 141 and the fourth adhesive layer 143 are both made of pressure sensitive adhesives.

In some embodiments, a thickness of the adhesive structure 14 is H2, and H2 satisfies that H2 is greater than or equal to 12 µm and less than or equal to 15 µm (i.e., 12 µm≤H2≤15 µm).

In these embodiments, in a case where the thickness H2 of the adhesive structure 14 is equal to or approaches 12 µm, it may ensure an adhesion and fixation effect of the adhesive structure 14 to be reliable, and effectively reduce the transmission resistance of signals in the adhesive structure 14. In a case where the thickness H2 of the adhesive structure 14 is equal to or approaches 15 µm, it may ensure the transmission effect of the signals, and further ensure the adhesive layer to have sufficient adhesion and fixation effect, so that the fingerprint sensor may be fixed firmly.

In some examples, the thickness H2 of the adhesive structure 14 may be 12 µm, 13 µm, or 15 µm.

For example, in the case where the adhesive structure 14 is of the multi-layer structure, thicknesses of the third adhesive layer 141 and the fourth adhesive layer 143 are both 3 µm, and a thickness of the second base layer 142 is 6 µm. For another example, the thickness of the third adhesive layer 141 is 6 µm, the thickness of the second base layer 142 is 6 µm, and the thickness of the fourth adhesive layer 143 is 3 µm.

In addition, it will be noted that, due to certain uncontrollable errors (e.g., manufacturing process errors, equipment accuracy and measurement errors), in a case where the thickness H2 of the adhesive structure 14 is 11.9 µm, 11.96 µm or other values (for example, a floating range of the thickness H2 does not exceed 0.5 µm), it may also be considered that the thickness H2 of the adhesive structure 14 satisfies the limiting condition of being equal to 12 µm; and in a case where the thickness H2 of the adhesive structure 14 is 15.1 µm, 15.35 µm or other values (for example, a floating range of the thickness H2 does not exceed 0.5 µm), it may also be considered that the thickness H2 of the adhesive structure 14 satisfies the limiting condition of being equal to 15 µm.

In some examples, the thickness of the adhesive structure 14 is less than or equal to a depth of the depression E. The adhesive structure 14 is accommodated in the depression to reserve a space for the fingerprint sensor, thereby reducing an overall thickness of the display screen, and prevent an adhesive material of the adhesive structure 14 from absorbing foreign objects.

In some examples, a sum of the thickness of the adhesive structure 14 and a thickness of the fingerprint sensor is less than or equal to the depth of the depression E. The adhesive structure 14 and the fingerprint sensor are both accommodated in the depression, so that the overall thickness of the display screen is reduced, which avoids an interference during an assembly of a display terminal.

Figure 8A:
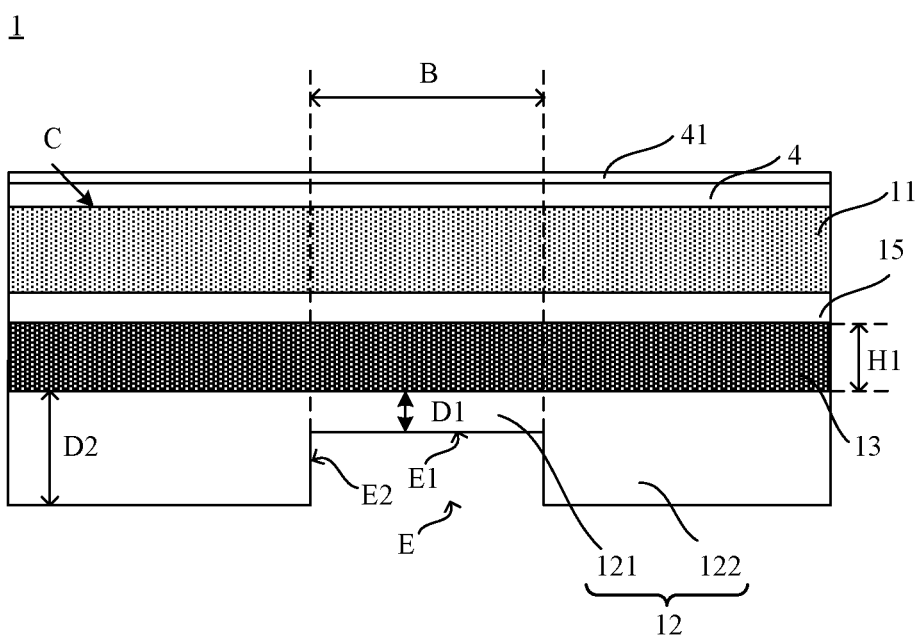
FIG. 8A is a cross-sectional view showing a structure of yet another flexible foldable display module, in accordance with some embodiments of the present disclosure.
Figure 8B:
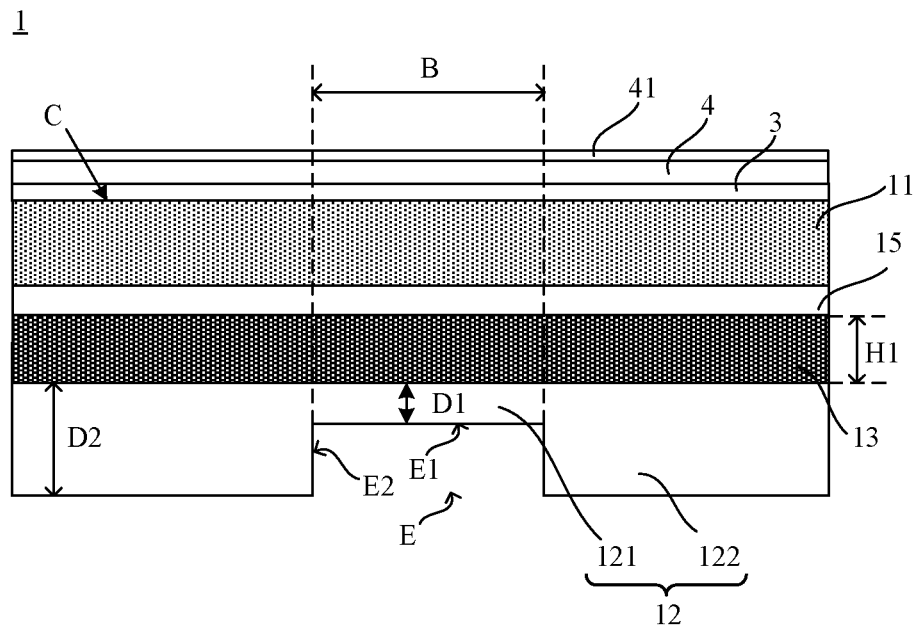
FIG. 8B is a cross-sectional view showing a structure of yet another flexible foldable display module, in accordance with some embodiments of the present disclosure.

In some embodiments, as shown in FIGS. 8A and 8B, the flexible foldable display module 1 further includes a back film 15 located between the adhesive layer 13 and the display substrate 11.

The back film 15 plays a role of supporting the display substrate 11. The back film and the display substrate 11 may be fixed together through adhesion, and a material of an adhesive layer therebetween includes thermosetting resin or light-curable resin. For example, the adhesive layer is made of a pressure sensitive adhesive, such as an acrylate pressure sensitive adhesive.

In some embodiments, referring to FIG. 8A, the flexible foldable display module 1 further includes a flexible cover plate 4 disposed on a side of the display surface of the display substrate. The flexible cover plate 4 may be used to protect the display substrate 11 from being scratched.

It will be understood that, the flexible cover plate 4 is in a transparent state, so that display images may be viewed through the flexible cover plate 4.

For example, a material of the flexible cover plate 4 includes at least one of colorless polyimide (CPI) or ultra-thin glass (UTG). With this design, the flexible cover plate may be thin and light and has a high hardness. Thus, the flexible foldable display module 1 may be light and thin, and the display substrate 11 of the flexible foldable display module 1 may be well protected.

For example, the flexible cover plate 4 includes an ultra-thin glass layer and a colorless polyimide layer that are away from the display substrate 11 sequentially, and an optically clear adhesive between the ultra-thin glass layer and the colorless polyimide layer.

For example, with continued reference to FIG. 8A, a hardened coating 41 is provided on a surface of the flexible cover plate 4 away from the display substrate 11. With this design, it may well improve toughness of the flexible cover plate 4, so that the display substrate 11 of the flexible foldable display module 1 may be well protected.

In some embodiments, referring to FIG. 8B, a polarizer 3 is provided between the flexible cover plate 4 and the display substrate 11. The polarizer 3 may be a circular polarizer. Here, the polarizer 3 may reduce a reflection of external light, and thus prevent a dazzling effect on the display surface of the flexible foldable display apparatus including the flexible foldable display module 1.

Optically clear adhesives may be provided on two sides of the polarizer 3, so that the polarizer 3 is bonded between the flexible cover plate 4 and the display substrate 11.

In some embodiments, the flexible foldable display apparatus 100 further includes a touch function layer on the display side of the display substrate. The touch function layer may detect a touch or press operation of a user, so as to provide a human-computer interaction interface for the user. In some examples, the touch function layer is disposed on the display surface C of the display substrate 11. In some other examples, the touch function layer is disposed on the flexible cover plate 4.

Figure 9A:
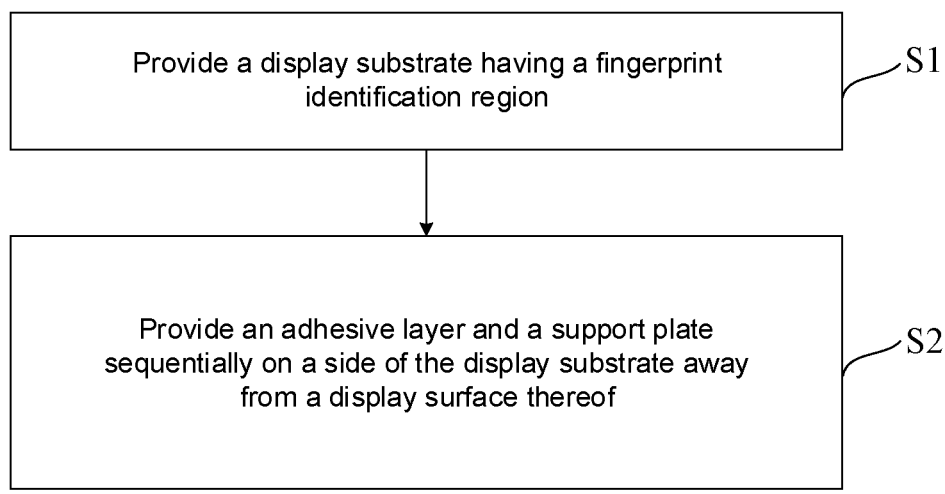
FIG. 9A is a flow diagram of a method for manufacturing a flexible foldable display module, in accordance with some embodiments of the present disclosure.
Figure 10:
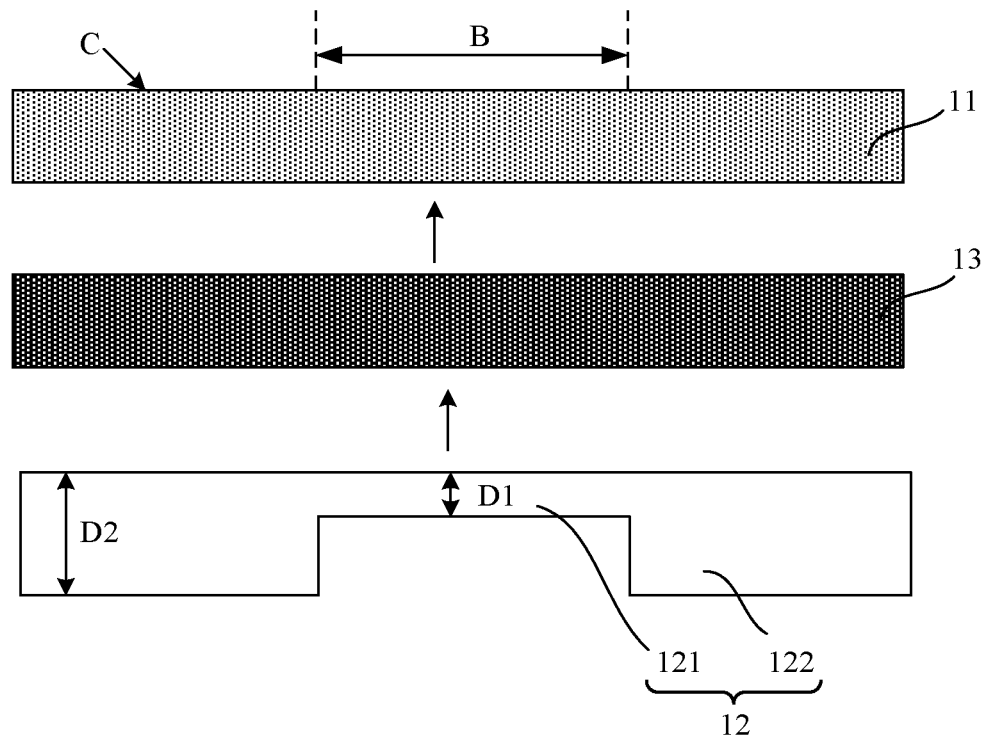
FIG. 10 is a diagram showing states of a flexible foldable display module corresponding to the manufacturing method in FIG. 9A.

Some embodiments of the present disclosure provide a method for manufacturing a flexible foldable display module, and the method is used to manufacture the flexible foldable display module 1 described above. Referring to FIGS. 9A and 10, the method includes the following steps.

In S1, the display substrate 11 is provided. The display substrate 11 has the fingerprint identification region B. For a position of the fingerprint identification region B, reference may be made to some of the above embodiments, and details will not be repeated here.

In S2, the adhesive layer 13 and the support plate 12 are sequentially provided on the side of the display substrate 11 away from the display surface C thereof.

For example, the formed adhesive layer 13 includes the first adhesive layer 131, the first base layer 132, and the second adhesive layer 133 that are stacked in sequence. For the arrangement of the first adhesive layer 131, the first base layer 132 and the second adhesive layer 133, reference may be made to the above embodiments, and details will not be repeated here.

In summary, in the flexible foldable display module 1 manufactured by the method for manufacturing the flexible foldable display module 1 provided in the embodiments of the present disclosure, the adhesive layer 13 is provided between the display substrate 11 and the support plate 12, and the adhesive layer 13 may include the first adhesive layer 131, the first base layer 132 and the second adhesive layer 133 that are stacked in sequence. In this way, the good effect of buffering and vibration damping may be realized. In addition, since at least the portion of the adhesive layer 13 covering the fingerprint recognition region B is configured to be of the dense structure (e.g., portions of the first adhesive layer 131, the first base layer 132 and the second adhesive layer 133 that are stacked sequentially corresponding to the fingerprint recognition region B), it may solve the problem that it is difficult to effectively transmit ultrasonic waves due to the large proportion of air gaps in a foam. Thus, it is conducive to provide the under-screen ultrasonic fingerprint sensor.

Figure 9B:
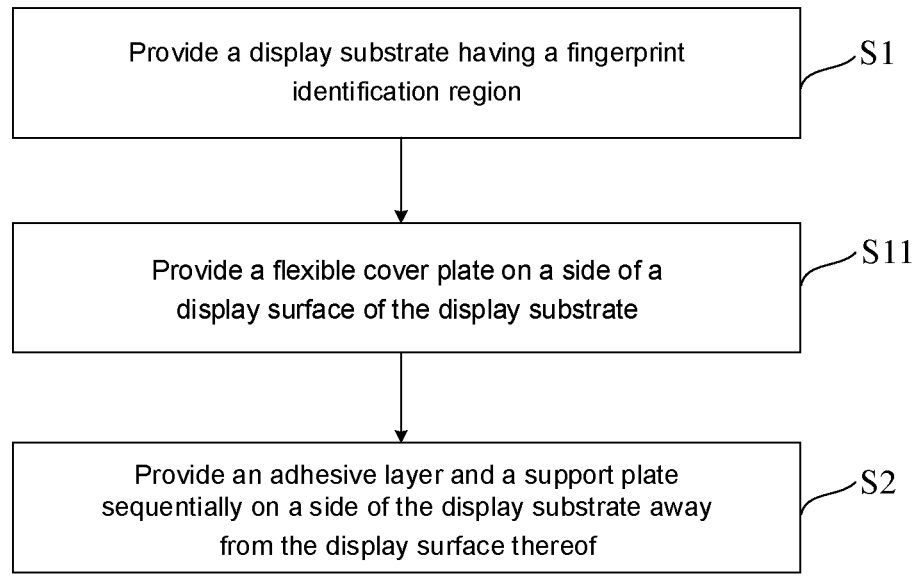
FIG. 9B is a flow diagram of another method for manufacturing a flexible foldable display module, in accordance with some embodiments of the present disclosure.

Based on this, for example, referring to FIG. 9B, the manufacturing method further includes the following step.

In S11, the flexible cover plate is provided on the side of the display surface of the display substrate.

In this step, as shown in FIG. 8A, the flexible cover plate 4 is located on the display surface of the display substrate 11. The arrangement and beneficial effects of the flexible cover plate 4 may refer to the above embodiments, and details will not be repeated here.

Figure 11:
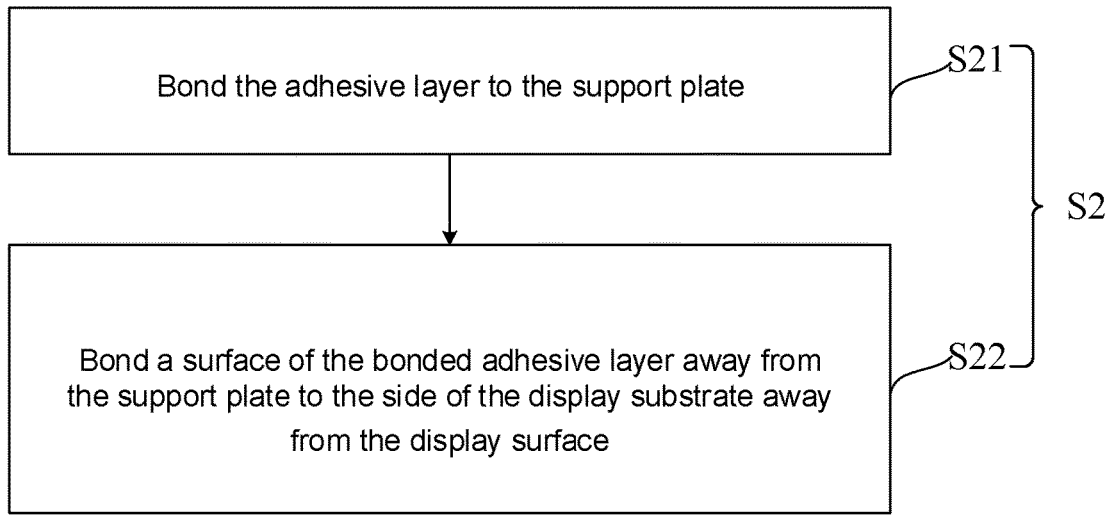
FIG. 11 is a flow diagram of yet another method for manufacturing a flexible foldable display module, in accordance with some embodiments of the present disclosure.
Figure 12:
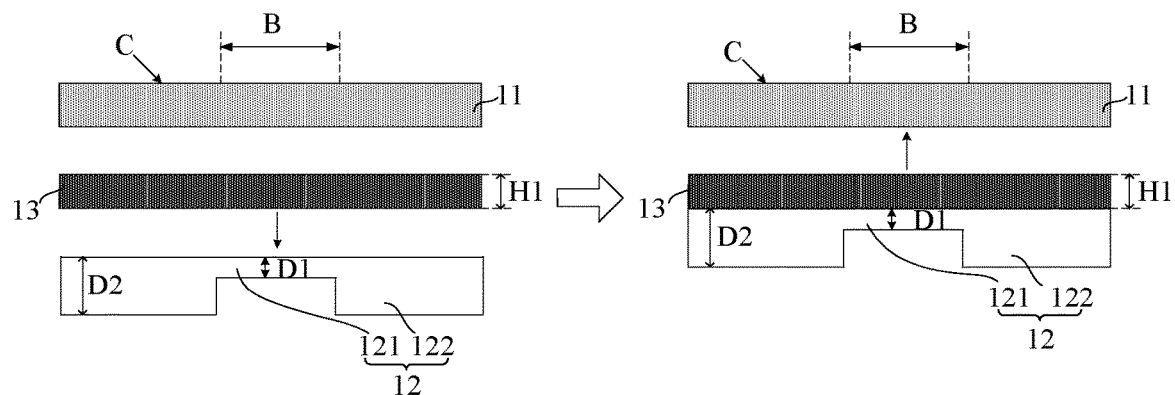
FIG. 12 is a diagram showing states of a flexible foldable display module corresponding to the manufacturing method in FIG. 11.

In some embodiments, referring to FIGS. 11 and 12, the step in which the adhesive layer and the support plate are sequentially provided on the side of the display substrate away from the display surface thereof includes the following steps.

In S21, the adhesive layer is bonded to the support plate.

In S22, a surface of the bonded adhesive layer away from the support plate is bonded to the side of the display substrate away from the display surface.

With this design, it is conducive to reducing a process difficulty and reducing a bonding tolerance between the support plate 12 and the display substrate 11.

Based on the technical solutions of the flexible foldable display module 1, some embodiments of the present disclosure provide a flexible foldable display apparatus 100.

Figure 13:
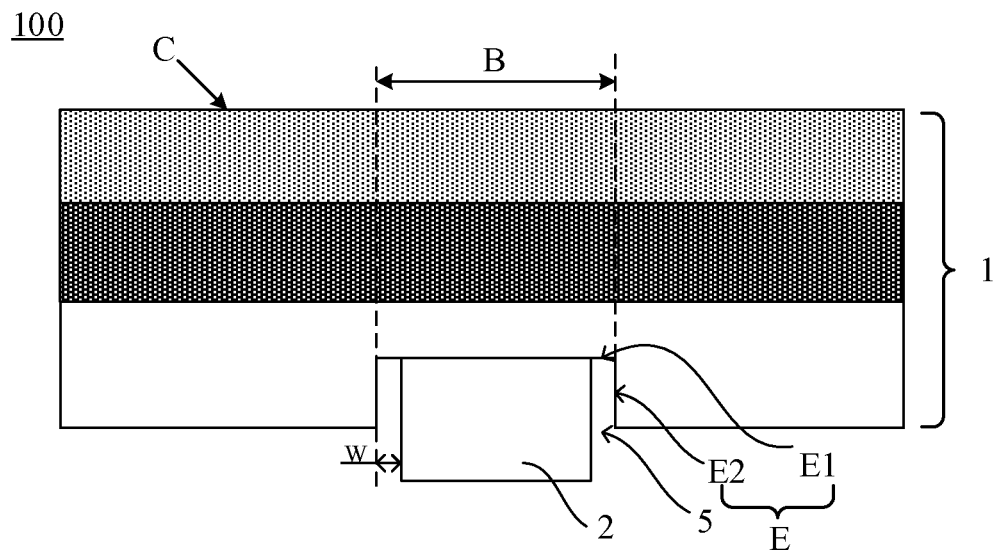
FIG. 13 is a cross-sectional view showing a structure of a flexible foldable display apparatus, in accordance with some embodiments of the present disclosure.

Referring to FIG. 13, the flexible foldable display apparatus 100 includes the flexible foldable display module 1 as described in any of the above embodiments and a fingerprint sensor 2 located on a side of the support plate 12 away from the display substrate 11.

The fingerprint sensor 2 may detect a fingerprint at a portion of the flexible foldable display module 1 corresponding to the fingerprint identification region B, so as to realize the function of fingerprint identification.

In addition, since the flexible foldable display apparatus provided in the embodiments of the present disclosure includes the flexible foldable display module 1 in the above embodiments, the flexible foldable display apparatus may have same technical effects with that of the flexible foldable display module 1, and solve same technical problems with that of the flexible foldable display module 1. Details will not be repeated here.

Figure 14:
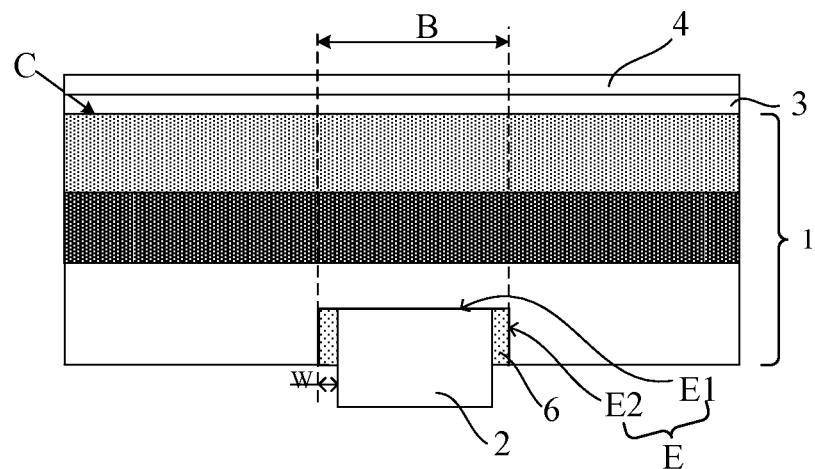
FIG. 14 is a cross-sectional view showing a structure of another flexible foldable display apparatus, in accordance with some embodiments of the present disclosure.

In some embodiments, as shown in FIGS. 13 to 14, the support plate 12 includes the first portion 121 and the second portion 122 other than the first portion 121, and the second portion 122 is disposed on at least one side of the first portion 121. The second portion 122 and the first portion 121 define a depression E, the depression E has a bottom surface E1 and side surfaces E2, and an opening of the depression E faces away from the display substrate 1. In this case, at least a portion of the fingerprint sensor 2 is located in the depression E, and a gap 5 exists between the fingerprint sensor 2 and the side surface E2 of the depression E.

The fingerprint sensor 2 is located in the depression E, and both the bottom surface E1 and the side surfaces E2 of the depression E may provide a good support surface for the fingerprint sensor 2, so as to ensure a reliable arrangement of the fingerprint sensor 2. By providing the gap 5 between the fingerprint sensor 2 and the side surfaces E2 of the depression E, it may be possible to facilitate an installation of the fingerprint sensor 2 into the depression E, and provide a necessary operation space for installing an instrument.

Figure 15:
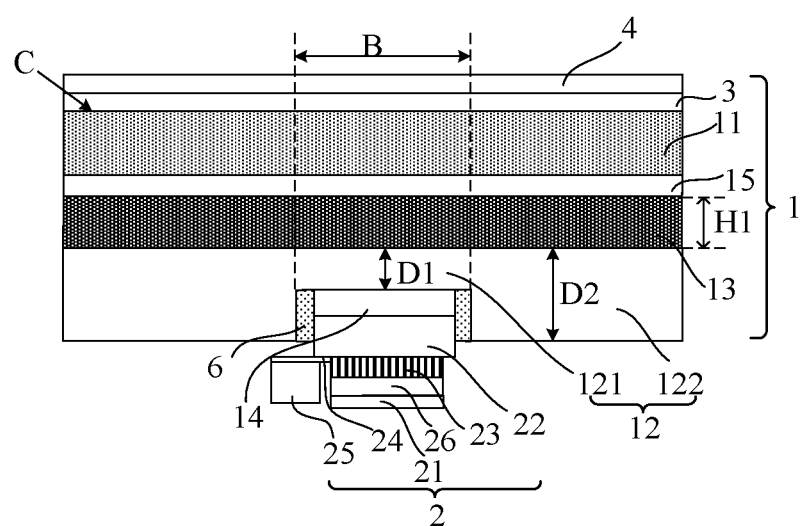
FIG. 15 is a cross-sectional view showing a structure of yet another flexible foldable display apparatus, in accordance with some embodiments of the present disclosure.

In some embodiments, as shown in FIGS. 14 and 15, the flexible foldable display apparatus 100 further includes an edge sealing adhesive 6 disposed in the gap 5.

In the embodiments, the edge sealing adhesive 6 is disposed in the gap. On one hand, a side wall of the fingerprint sensor 2 may be bonded to a side surface E2 of the depression E through the edge sealing adhesive 6, so that a fixation effect of the fingerprint sensor 2 may be strengthened. On the other hand, the edge sealing adhesive 6 is disposed in the gap 5 for sealing, so as to prevent impurities and water vapor, etc. from contaminating the fingerprint sensor 2.

In some examples, the edge sealing adhesive 6 is glue that is cured at a room temperature and easy to repair.

In some embodiments, as shown in FIGS. 13 to 15, a width of the gap 5 is W, and W satisfies that W is greater than or equal to 1 mm (i.e., W≥1 mm).

In the embodiments, the width W of the gap 5 is greater than or equal to 1 mm, which may provide sufficient operation space for the instrument when the fingerprint sensor 2 is installed. In a case where the width W of the gap 5 is equal to 1 mm or approaches 1 mm, the width W of the gap 5 is not excessively large. That is, a distance between the side wall of the fingerprint sensor 2 and the side surface E2 of the depression E is not excessively large. Thus, it may be ensured that the side surface E2 of the depression E may support the fingerprint sensor 2 well.

In some embodiments, the width W of the gap 5 satisfies that W is greater than or equal to 3 mm and less than or equal to 4 mm (i.e., 3 mm≤W≤4 mm).

In a case where the width W of the gap 5 is in the range of 3 mm to 4 mm, inclusive, the width W of the gap 5 is not excessively small, which may satisfy requirements of an installation accuracy for the instrument and an operation space for an installation process; and the width W of the gap 5 is not excessively large, which may avoid unnecessary materials to be removed and ensure an overall strength of the support plate 12.

In some examples, the width W of the gap 5 may be 3 mm, 3.5 mm or 4 mm.

In addition, it will be noted that, due to certain uncontrollable error (e.g., manufacturing process errors, equipment accuracy and measurement errors), in a case where the width W of the gap is 2.8 mm, 2.91 mm or other values (for example, a floating range of the width W of the gap does not exceed 0.5 mm), it may also be considered that the width W of the gap satisfies the limiting condition of being equal to 3 mm; and in a case where the width W of the gap is 4.4 mm, 4.45 mm or other values (for example, a floating range of the width W of the gap does not exceed 0.5 mm), it may also be considered that the width W of the gap satisfies the limiting condition of being equal to 4 mm.

In some embodiments, as shown in FIG. 15, the fingerprint sensor 2 includes a circuit substrate 22 disposed proximate to the adhesive structure 14, a piezoelectric material layer 23 located on a side of the circuit substrate 22 away from the adhesive structure 14, an electrode layer 26 located on a side of the piezoelectric material layer 23 away from the circuit substrate 22, and an encapsulation protective film 21 located on a side of the electrode layer 26 away from the piezoelectric material layer 23.

The circuit substrate 22 includes a plurality of thin film transistors (TFTs). The thin film transistors at different positions may control circuits at different positions to generate different signals. The piezoelectric material layer 23 may be made of copolymer. The electrode layer 26 may be made of silver (Ag). The electric field generated between the electrode layer 26 and the circuit substrate 22 cooperates with the piezoelectric material layer 23 to achieve conversion of ultrasonic wave fingerprint signals and electric signals. That is, the electrical signals may be converted into the ultrasonic wave signals, or the ultrasonic wave signals may be converted into the electrical signals.

During operation, the ultrasonic wave signals are firstly sent to the fingerprint identification region of the flexible foldable display module 1 by the fingerprint sensor 2, and then the ultrasonic wave fingerprint signals reflected back are converted into the electrical signals by the fingerprint sensor 2. For example, the sent ultrasonic wave signals firstly reach the finger on the side of the display surface C of the display substrate 11. Due to a difference in acoustic impedance between the skin of the finger and the air, echo intensities of the ultrasonic waves are different. The fingerprint sensor 2 converts ultrasonic wave fingerprint signals reflected back into the electrical signals, and calculates and detects the echo intensities of the ultrasonic wave signals at different positions. As a result, it may be possible to distinguish ridges and valleys of the fingerprints, thereby realizing the fingerprint identification.

The encapsulation protective film 21 may be a die attach film (DAF) layer. The encapsulation protective film 21 may have a good protective effect on the electrode layer 26, so as to prevent the material of the electrode layer 26 from oxidizing, and thus ensure the performance of the electrode layer 26.

It will be noted that, FIG. 15 shows an example in which the encapsulation protective film 21 covers a surface of the electrode layer 26 away from the circuit substrate 22. It will be understood that, in some other examples, the encapsulation protective film 21 may further cover side surfaces of the electrode layer 26, so that the electrode layer 26 may be well protected.

In some examples, as shown in FIG. 15, the fingerprint sensor 2 further includes a chip on film (COF) 24 disposed on the side of the circuit substrate 22 away from the adhesive structure 14, and a control chip 25 disposed on the chip on film 24. The control chip 25 is used to realize functions such as timing control and image processing. The circuit substrate 22 and the control chip 25 communicate with each other through the chip on film 24, so that the fingerprint sensor 2 realizes the function of fingerprint recognition.

In some examples, referring to FIG. 15, in a signal transmission direction of the fingerprint sensor 2, thicknesses of the structures are as follows. An overall thickness of the flexible cover plate 4 and the hardened coating 41 is in a range of 50 μm to 190 μm, inclusive, a thickness of the optically clear adhesive between the flexible cover plate 4 and the polarizer 3 is about 50 μm, a thickness of the polarizer 3 is about 106 μm, a thickness of the display substrate 11 is about 40 μm, a thickness of the back film 15 is about 63 μm; a thickness of the adhesive layer 13 is in a range of 25 μm to 50 μm, inclusive, the thickness D1 of the first portion 121 is about 50 μm, and the thickness of the adhesive structure 14 is about 12 μm.

It will be noted that, the term such as "about" as used herein includes a stated value and an average value within an acceptable range of deviation of a particular value. The acceptable range of deviation is determined by a person of ordinary skill in the art in view of the measurement in question and errors associated with the measurement of a particular quantity (i.e., the limitations of the measurement system).

With this design, on one hand, since the thickness D1 of the first portion 121 is less than the thickness D2 of the second portion 122, the fingerprint sensor 2 is arranged on the first portion 121, which may reduce the attenuation of the signals passing through the first portion 121 and ensure the transmission efficiency and the response sensitivity. On the other hand, for the support plate 12, the thickness D1 of the first portion 121 is less than the thickness D2 of the second portion 122, compared with a complete through structure in which the window is provided in the support plate 12 in the related art, the local thinning of the support plate 12 may enhance the supporting force of the first portion 121 of the support plate 12, so as to avoid the problems such as local collapse or poor impression at a position, corresponding to the first portion 121, of the display substrate 11 on the side of the support plate 12.

The flexible foldable display apparatus 100 provided in some embodiments of the present disclosure may serve as any product or component having a display function, such as a television, a mobile phone, a tablet computer, a notebook computer, a digital photo frame or a navigator, and an application of the flexible foldable display apparatus 100 is not limited in the embodiments of the present disclosure.

In some embodiments, the flexible foldable display apparatus 100 includes an electroluminescent display or any other type of display.

In some examples, the electroluminescent display includes an organic light-emitting diode (OLED) display, a quantum dot light-emitting diode (QLED) display or a micro light-emitting diode (micro-LED) display.

The flexible foldable display apparatus 100 may be of a single-folding structure. That is, the display apparatus 100 is folded in half only once, so that an exposed area of the display apparatus 100 may be reduced by half.

In addition, the flexible foldable display apparatus 100 may be of a multi-folding structure, so that the display apparatus 100 may be folded into a structure having a smaller exposed area. The multi-folding structure includes two or more folding portions, and the positions of the folding portions are not limited. For example, two or more folding portions may be set at intervals in a longitudinal direction (or a transverse direction) of the flexible foldable display module 1 in FIG. 1, so as to realize the multi-folding effect.

In addition, the flexible foldable display apparatus 100 may be any apparatus that displays images whether in motion (e.g., a video) or stationary (e.g., a static image), and whether literal or graphical. More specifically, it is anticipated that the described embodiments may be implemented in or associated with a variety of electronic devices. The variety of electronic devices are, but not limited to, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television monitors, flat-panel displays, computer monitors, automobile displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

The foregoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A flexible foldable display module, comprising:
   a display substrate, the display substrate being provided with a fingerprint identification region therein;
   a flexible cover plate disposed on a side of a display surface of the display substrate;
   a support plate located on a side of the display substrate away from the display surface thereof, wherein the support plate includes a first portion and a second portion other than the first portion, the first portion covers at least the fingerprint identification region, a thickness of the first portion is less than a thickness of the second portion, and a surface of the first portion proximate to the display substrate is flush with a surface of the second portion proximate to the display substrate; and
   an adhesive layer located between the support plate and the display substrate, the adhesive layer including a first adhesive layer, a first base layer and a second adhesive layer that are stacked in sequence.

2. The flexible foldable display module according to claim 1, wherein
   the first adhesive layer includes at least one of an optically clear adhesive or a pressure sensitive adhesive, and the second adhesive layer includes at least one of another optically clear adhesive or another pressure sensitive adhesive.

3. The flexible foldable display module according to claim 1, wherein
   a thickness of the adhesive layer is greater than or equal to 25 μm and less than or equal to 50 μm.

4. The flexible foldable display module according to claim 1, wherein
   the thickness of the first portion is greater than or equal to 30 μm and less than or equal to 50 μm.

5. The flexible foldable display module according to claim 1, wherein
   the thickness of the first portion is 0.2 to 0.34 times the thickness of the second portion.

6. The flexible foldable display module according to claim 1, wherein
   the support plate is a metal plate.

7. The flexible foldable display module according to claim 1, wherein
   at least a portion of the adhesive layer covering the fingerprint identification region is configured to be in a transparent state; and
   the support plate is a light-transmissive plate, and a light transmittance of an entirety of a portion of the first portion covering the fingerprint identification region and the portion of the adhesive layer covering the fingerprint identification region is greater than 85%.

8. The flexible foldable display module according to claim 1, wherein
   the second portion is disposed on at least one side of the first portion, the second portion and the first portion define a depression, the depression has a bottom surface and side surfaces, and an opening of the depression faces away from the display substrate.

9. The flexible foldable display module according to claim 8, further comprising:
   an adhesive structure disposed on the bottom surface of the depression.

10. The flexible foldable display module according to claim 9, wherein
    a thickness of the adhesive structure is less than or equal to a depth of the depression.

11. The flexible foldable display module according to claim 9, wherein
    a thickness of the adhesive structure is greater than or equal to 12 μm and less than or equal to 15 μm.

12. The flexible foldable display module according to claim 1, further comprising:
    a back film located between the adhesive layer and the display substrate.

13. The flexible foldable display module according to claim 1, wherein a material of the flexible cover plate includes at least one of colorless polyimide or ultra-thin glass.

14. The flexible foldable display module according to claim 1, further comprising a hardened coating on a surface of the flexible cover plate away from the display substrate.

15. A flexible foldable display apparatus, comprising:
the flexible foldable display module according to claim 1; and
a fingerprint sensor located on a side of the support plate away from the display substrate.

16. The flexible foldable display apparatus according to claim 15, wherein the second portion is disposed on at least one side of the first portion, and the second portion and the first portion define a depression for installing the fingerprint sensor; the depression has a bottom surface and side surfaces, and an opening of the depression faces away from the display substrate;
at least a portion of the fingerprint sensor is located in the depression, and the fingerprint sensor and the side surfaces of the depression have a gap therebetween.

17. The flexible foldable display apparatus according to claim 16, wherein the fingerprint sensor includes:
a circuit substrate disposed proximate to the bottom surface of the depression;
a piezoelectric material layer located on a side of the circuit substrate away from the bottom surface of the depression;
an electrode layer located on a side of the piezoelectric material layer away from the circuit substrate;
an encapsulation protective film located on a side of the electrode layer away from the piezoelectric material layer;
a chip on film (COF) disposed on the side of the circuit substrate away from the bottom surface of the depression; and
a control chip disposed on the chip on film.

18. The flexible foldable display apparatus according to claim 16, further comprising:
an edge sealing adhesive disposed in the gap between the fingerprint sensor and the side surfaces of the depression.

19. A method for manufacturing a flexible foldable display module, the method comprising:
providing a display substrate, the display substrate being provided with a fingerprint identification region therein;
providing a flexible cover plate on a side of a display surface of the display substrate; and
providing an adhesive layer and a support plate sequentially on a side of the display substrate away from the display surface thereof, wherein the support plate includes a first portion and a second portion other than the first portion, the first portion covers at least the fingerprint identification region, a thickness of the first portion is less than a thickness of the second portion, and a surface of the first portion proximate to the display substrate is flush with a surface of the second portion proximate to the display substrate; and the adhesive layer includes a first adhesive layer, a first base layer and a second adhesive layer that are stacked in sequence.

20. The method for manufacturing the flexible foldable display module according to claim 19, wherein providing the adhesive layer and the support plate sequentially on the side of the display substrate away from the display surface thereof includes:
bonding the adhesive layer to the support plate; and
bonding a surface of the bonded adhesive layer away from the support plate to the side of the display substrate away from the display surface.

* * * * *